United States Patent [19]

Fujimoto et al.

[11] Patent Number: 4,636,454
[45] Date of Patent: Jan. 13, 1987

[54] METHOD FOR THE PREPARATION OF A PATTERNED PHOTORESIST LAYER AND A PHOTORESIST COMPOSITION THEREFOR

[75] Inventors: Teruo Fujimoto; Takeo Kazama; Minoru Takamizawa; Akira Yamamoto, all of Niigata, Japan

[73] Assignee: Shin-Etsu Chemical Co., Ltd., Tokyo, Japan

[21] Appl. No.: 753,604

[22] Filed: Jul. 10, 1985

[30] Foreign Application Priority Data

Jul. 18, 1984 [JP] Japan .................................. 59-148778

[51] Int. Cl.$^4$ ........................ G03C 1/52; G03C 1/71; G03C 5/16; C08F 30/08
[52] U.S. Cl. .................................... 430/197; 430/287; 430/325; 430/311; 522/65; 522/148; 526/279
[58] Field of Search .................. 526/279; 204/159.13; 430/287, 325, 311, 197, 288; 522/65, 148

[56] References Cited

U.S. PATENT DOCUMENTS 4,301,231 11/1981 Atarashi et al. ................... 526/279

FOREIGN PATENT DOCUMENTS 60-90205  5/1985 Japan ................................. 526/279
60-84310  5/1985 Japan ................................. 526/279
60-88015  5/1985 Japan ................................. 526/279
60-91351  5/1985 Japan ................................. 526/279

Primary Examiner—John E. Kittle
Assistant Examiner—Cynthia Hamilton
Attorney, Agent, or Firm—Hopgood, Calimafde, Kalil, Blaustein & Judlowe

[57] ABSTRACT

The negative-working photoresist composition of the invention comprises, as the polymeric constituent thereof, a polymeric compound obtained by the anionic living polymerization of a vinylphenyl substituted-vinyl dimethyl silane compound represented by the general formula

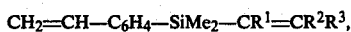

$$CH_2=CH-C_6H_4-SiMe_2-CR^1=CR^2R^3,$$

in which Me is a methyl group and $R^1$, $R^2$ and $R^3$ are each a hydrogen atom, methyl group or ethyl group, at least one of the $R^1$, $R^2$ and $R^3$ being not a hydrogen atom, to cause the polymerization only at the styrenic double bond, the other double bond in the same molecule remaining unpolymerized. By virtue of the high density of the double bonds in the polymer molecules, the photoresist composition is highly sensitive to irradiation with actinic rays and capable of giving a patterned photoresist layer having excellent resolving power and resistance against dry etching.

6 Claims, No Drawings

METHOD FOR THE PREPARATION OF A PATTERNED PHOTORESIST LAYER AND A PHOTORESIST COMPOSITION THEREFOR

BACKGROUND OF THE INVENTION

The present invention relates to a method for the preparation of a patterned photoresist layer on the surface of a substrate and a photoresist composition used therefor. More particularly, the invention relates to a method for the preparation of a patterned photoresist layer having excellent resolving power and resistance against dry etching on the surface of a substrate and a photoresist composition therefor.

In the electronics of recent years, LSIs, ultra-LSIs and other extremely fine electronic devices can be manufactured only by the aid of fabrication technologies in the submicron range or finer by the photolithographic techniques of patterning using a photoresist material so that it is eagerly desired to develop a photoresist composition of high sensitivity capable of giving an extremely fine patterned photoresist layer with high resolving power.

While photoresist compositions used in the electronic technology are classified into positive-working and negative-working ones, the major trend in the technology is in the use of a negative-working photoresist composition which can be crosslinked and insolubilized when irradiated with actinic rays to form a solubility difference between the irradiated and unirradiated areas. In order to work satisfactorily, negative-working photoresist compositions must satisfy several requirements in the properties including that (1) the composition should be crosslinked with high sensitivity when it is irradiated with actinic rays, e.g. ultraviolet, far ultraviolet, electron beams and X-rays, and insolubilized, (2) the irradiation by the actinic rays can produce a change as great as possible in the molecular structure and physical properties or, in particular, in the solubility behavior of the composition, (3) the polymeric constituent of the composition should have an adequate molecular weight with a molecular weight distribution as narrow as possible in order to obtain a high sensitivity and high resolving power, (4) the glass transition point $T_g$ of the polymer should be high enough, (5) good adhesion should be obtained between the photoresist layer and the substrate surface, (6) the photoresist layer should withstand and little be affected by dry etching, and so on.

The negative-working photoresist compositions currently on use mostly comprises a cyclized rubber as the polymeric constituent but none of the commercially available photoresist compositions can satisfy the above mentioned requirements, in particular, in respect of the resolving power and the resistance against dry etching.

SUMMARY OF THE INVENTION

An object of the present invention is therefore to provide a novel method for the preparation of a patterned photoresist layer on the surface of a substrate having excellent resolving power and resistance against dry etching.

Another object of the invention is to provide a novel photoresist composition used for the preparation of a patterned photoresist layer on the surface of a substrate satisfying the above mentioned requirements for the negative-working photoresist composition.

The negative-working photoresist composition provided by the present invention comprises, as the polymeric constituent thereof: a polymeric compound which is a product of the styrenic polymerization of a (substituted vinyl silyl)-substituted styrene compound represented by the general formula $$Ch_2=CH-C_6H_4-SiMe_2-CR^1=CR^2R^3, \quad (I)$$

in which Me is a methyl group and $R^1$, $R^2$ and $R^3$ are each a hydrogen atom, methyl group or ethyl group, at least one of the $R^1$, $R^2$ and $R^3$ being not a hydrogen atom.

DETAILED DESCRIPTION OF THE PREFERRED EMBODIMENTS

As is described above, the polymeric constituent in the inventive photoresist composition, which is capable of giving a patterned photoresist layer having a resolving power of 0.5 μm or higher and excellent resistance against dry etching, is obtained by the polymerization of the styrene derivative represented by the general formula (I) given above. This styrene derivative can readily be synthesized by the dechlorination reaction between a chlorine-substituted styrene of the formula $CH_2=CH-C_6H_4-Cl$ and a substituted-vinyl dimethyl chlorosilane of the formula $Cl-SiMe_2-CR^1=CR^2R^3$, in which Me, $R^1$, $R^2$ and $R^3$ each have the same meaning as defined above.

Exemplary of such a styrene derivative are those expressed by the following structural formulas denoting 1,4-phenylene and 1,3-phenylene groups by the symbols of (1,4-Phn) and (1,3-Phn), respectively:

$CH_2=CH-(1,4-Phn)-SiMe_2-CH=CH-Me$;
$CH_2=CH-(1,4-Phn)-SiMe_2-CH=CH_2$;
$CH_2=CH-(1,3-Phn)-SiMe_2-CH=CH-Me$;
$CH_2=CH-(1,4-Phn)-SiMe_2-CH=CMe_2$;
$CH_2=CH-(1,4-Phn)-SiMe_2-CH=Ch-Et$; and
$CH_2=CH-(1,4-Phn)-SiMe_2-CMe=CH-Me$, in which Me and Et denote a methyl and an ethyl group, respectively.

The above described styrene derivatives as the monomer for the polymeric constituent in the invention photoresist composition should preferably be purified, prior to polymerization, by use of a purification agent which is a mixture of triphenylmethyl lithium $Ph_3C\cdot Li$ and lithium bromide LiBr under high vacuum. It is of course that the above described styrene derivatives may be used either singly or as a mixture of two kinds or more according to need.

It is essential that the polymerization of the styrene derivative should be performed under conditions in which the polymerization reaction proceeds preferentially at the styrenic double bond, i.e. the double bond in the vinyl group directly bonded to the benzene nucleus, and the unsaturation in the substituted vinyl group bonded to the silicon atom remains unpolymerized. Such selective polymerization can proceed when the reaction is performed by the mechanism of anoinic living polymerization. Preferable polymerization conditions for the selective polymerization of the styrene derivative have been established by the extensive investigations undertaken by the inventors on the types of solvent and polymerization initiator, polymerization temperature and the like. According to the established procedure, the styrene derivative is polymerized in an ether solvent such as 2-methyl tetrahydrofuran, 4,4-dimethyl-1,3-metadioxane, dialkyl ethers and the like under high vacuum in the presence of a polymerization initiator which is preferably cumyl cesium and the like at a temperature of $-50°$ C. or below. The reaction product is a monodisperse polymer having a substantially linear molecular structure. Analysis of the polymer by the infrared absorption spectroscopy, NMR spectroscopy and gel permeation chromatography indicates that the polymerization has taken place selectively at the styrenic double bond with the other double bond in the same molecule remaining unreacted and the molecular weight distribution of the polymer is an approximately ideal monodisperse with the ratio of the weight-average molecular weight $M_w$ to the number-average molecular weight $M_n$ equal to 1.02 or smaller.

The thus obtained monodisperse linear polymer compound is formed of the repeating monomeric units of the formula

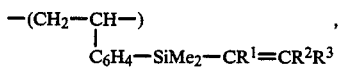

in which Me, $R^1$, $R^2$ and $R^3$ each have the same meaning as defined above, and the polymer is soluble in several organic solvents including toluene, xylene and tetrahydrofuran. By virtue of the high density of the unsaturated groups with a substituted vinyl silyl group in each repeating monomeric unit, the polymer is highly sensitive to the actinic rays to give a crosslinked polymer so that the polymer is very useful as a polymeric constituent in a negative-working photoresist composition capable of giving a patterned photoresist layer with excellent resistance against dry etching.

The photoresist composition of the invention can be prepared by dissolving the above described polymer in an organic solvent in an adequate concentration suitable for application. If desired, the solution may be admixed with a photosensitizer compound such as 2,6-di(4-azidobenzylidene) cyclohexanone and the like so that the photosensitivity of the composition is further enhanced.

In the following, examples are given to illustrate the prepared and identification of the polymer compound as the polymeric constituent of the inventive photoresist composition and the performance of the photoresist composition comprising the polymer in more detail.

EXAMPLE 1

Into a flask of 500 ml capacity wer introduced 12 g (0.5 mole) of metallic magnesium, 200 ml of tetrahydrofuran and 0.5 ml of ethyl bromide and then 69 g of 4-chlorostyrene were added dropwise into the reaction mixture in the flask under reflux in a stream of nitrogen gas over a period of 3 hours to synthesize the Grignard reagent of 4-chlorostyrene.

Into the thus prepared Grignard reagent was added dropwise a mixture of 47 g of 1-propenyl dimethyl chlorosilane ClSiMe$_2$—CH=CH—Me and 20 g of isopropenyl dimethyl chlorosilane ClSiMe$_2$—CMe=CH$_2$ at a temperature of 20° to 30° C. to effect the reaction. The reaction mixture was poured into a large volume of water and the organic solution taken from the mixture was subjected to distillation under reduced pressure to give 80 g of a distillate which was identified by analysis to be a 7:3 by weight mixture of 4-vinylphenyl 1-propenyl dimethyl silane CH$_2$=CH—(1,4-Phn)—SiMe$_2$—CH=CH—CH$_3$ and 4-vinylphenyl isopropenyl dimethyl silane CH$_2$=CH—(1,4-Phn)—SiMe$_2$—CMe=CH$_2$.

After purification of the thus obtained reaction product by use of a mixture of triphenylmethyl lithium and lithium bromide under high vacuum, 6 g of the styrene derivative mixture were subjected to anoinic living polymerization in 100 ml of purified 4,4-dimethyl-1,3-dioxane as the solvent with addition of $1.2 \times 10^{-4}$ mole of cumyl cesium as the polymerization initiator at a temperature of $-78°$ C. over a period of 2 hours.

After completion of the polymerization reaction, the reaction mixture in the flask was poured into a large volume of methyl alcohol to precipitate the polymer and the precipitates were collected by filtration, washed with methyl alcohol and dried into a white powdery product. The yield of the product was almost 100%. The polymer product has a glass transition point $T_g$ of 102° C. The analysis of the polymer by the infrared absorption spectroscopy and NMR spectrometry indicated that the polymerization reaction took place only at the styrenic double bonds and the unsaturation in the substituted vinyl silyl groups remained unpolymerized.

The number-average molecular weight $M_n$ of this polymer was $4.6 \times 10^4$ by the membrane osmotic pressure method and it was very excellent monodisperse polymer with the ratio $M_w/M_n$ equal to 1.02.

In the next place, a photoresist solution was prepared by dissolving the polymer in xylene in a concentration of 15% by weight with admixture of 2,6-di(4-azidobenzylidene) cyclohexanone in an amount of 3% by weight based on the polymer.

The photoresist solution was applied by spin coating on to a semiconductor silicon wafer having a surface layer of SiO$_2$ in a thickness of 1 μm as dried of the photoresist layer followed by prebaking at 100° C. for 20 minutes. The photoresist layer was exposed to ultraviolet light in a conventional manner on a mirror-projection mask aligner (Model 500-F-1 by Canon Co.) and developed with diethyl ether as the developer liquid. The thus formed patterned photoresist layer of line-and-space pattern had a resolving power of 0.5 μm.

Separately, another silicaon wafer was coated with the photoresist solution and a cured photoresist layer was formed by the whole-surface exposure to ultraviolet light. The photoresist layer was subjected to the test of the resistance against dry etching by the measurement of the decrease in the thickness thereof when sputtering etching with oxygen was undertaken in an apparatus of parallel plate-electrode type for dry etching. The result was that absolutely no decrease was found in the thickness of the photoresist layer after 30 minutes under the conditions of dry etching to indicate the excellent resistance of the phtotresist layer against dry etching.

The conclusion is that the polymeric composition here prepared can be an excellent negative-working photoresist composition.

EXAMPLES 2 TO 4

The photoresist solutions prepared in Examples 2, 3 and 4 contained the polymers of 4-vinylphenyl 2-methyl-1-propenyl dimethyl silane, 3-vinylphenyl 1-propenyl dimethyl silane and 4-vinylphenyl 1-butenyl dimethyl silane, respectively, obtained in substantially the same manner as in the preceding example from the respective monomers each in a yield of approximately 100%. The glass transistion temperature $T_g$, weight-average molecular weight $M_w$ and the ratio of $M_w/M_n$ of each of these polymers are shown in Table 1 below.

The test of these photoresist solutions was undertaken in the same manner as in Example 1 to give the results that the resolving power of the patterned photoresist layers and the resistance against dry etching of the cured photoresist layers were quite staisfactory as in Example 1.

TABLE 1

| Example No. | $T_g$ | $M_w$ | $M_w/M_n$ |
|---|---|---|---|
| 2 | 100 | $4.4 \times 10^4$ | 1.02 |
| 3 | 98 | $4.7 \times 10^4$ | 1.04 |
| 4 | 97 | $4.3 \times 10^4$ | 1.02 |

What is claimed is:

1. A negative-working photoresist composition which comprises, as the polymeric constituent thereof: a polymeric compound which is a product of the styrenic polymerization of a vinylphenyl substituted-vinyl dimethyl silane compound represented by the general formula $$CH_2=CH-C_6H_4-SiMe_2-CR^1=CR^2R^3,$$

in which Me is a methyl group and $R^1$, $R^2$ and $R^3$ are each a hydrogen atom, methyl group or ethyl group, at least one of the $R^1$, $R^2$ and $R^3$ being not a hydrogen atom.

2. The negative-working photoresist composition as claimed in claim 1 wherein the vinylphenyl substituted-vinyl dimethyl silane compound is selected from the class consisting of 4-vinylphenyl 1-propenyl dimethyl silane, 4-vinylphenyl 2-methyl-1-propenyl dimethyl silane, 3-vinylphenyl 1-propenyl dimethyl silane and 4-vinylphenyl 1-butenyl dimethyl silane.

3. The negative-working photoresist composition as claimed in claim 1 which further comprises an organic solvent dissolving the polymeric compound therein.

4. The negative-working photoresist composition as claimed in claim 3 which further comprises a photosensitizer.

5. The negative-working photoresist composition as claimed in claim 4 wherein the photosensitizer is 2,6-di(4-azidobenzylidene) cyclohexanone.

6. A method for the preparation of a patterned photoresist layer on the surface of a substrate which comprises the steps of:

(a) coating the substrate surface with a photoresist composition comprising a polymeric compound which is a product of the styrenic polymerization of a vinylphenyl substituted-vinyl dimethyl silane compound represented by the general formula $$CH_2=CH-C_6H_4-SiMe_2-CR^1=CR^2R^3,$$

in which Me is a methyl group and $R^1$, $R^2$ and $R^3$ are each a hydrogen atom, methyl group or ethyl group, at least one of the $R^1$, $R^2$ and $R^3$ being not a hydrogen atom, to form a photoresist layer;

(b) irradiating the photoresist layer patternwise with actinic rays; and (c) dissolving away the photoresist layer on the areas not irradiated with the actinic rays with a solvent.

* * * * *